United States Patent
Grunzke

(10) Patent No.: US 9,520,170 B2
(45) Date of Patent: Dec. 13, 2016

(54) VOLUME SELECT FOR AFFECTING A STATE OF A NON-SELECTED MEMORY VOLUME

(71) Applicant: Micron Technology, Inc., Boise, ID (US)

(72) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/833,551

(22) Filed: Aug. 24, 2015

(65) Prior Publication Data

US 2015/0364175 A1 Dec. 17, 2015

Related U.S. Application Data

(62) Division of application No. 13/935,318, filed on Jul. 3, 2013, now Pat. No. 9,117,504.

(51) Int. Cl.
| | | |
|---|---|---|
| *G11C 8/00* | (2006.01) | |
| *G11C 8/12* | (2006.01) | |
| *G11C 5/14* | (2006.01) | |
| *G11C 8/06* | (2006.01) | |
| G11C 16/10 | (2006.01) | |
| G11C 7/10 | (2006.01) | |
| G11C 16/08 | (2006.01) | |

(52) U.S. Cl.
CPC .............. *G11C 8/12* (2013.01); *G11C 5/147* (2013.01); *G11C 5/148* (2013.01); *G11C 8/06* (2013.01); *G11C 5/14* (2013.01); *G11C 7/1006* (2013.01); *G11C 16/08* (2013.01); *G11C 16/10* (2013.01)

(58) Field of Classification Search
CPC ....... G11C 16/08; G11C 16/10; G11C 7/1006; G11C 7/1051; G11C 5/147; G11C 5/14; G11C 5/141; G11C 5/143; G11C 8/12; G11C 7/18
USPC .............. 365/185.11, 189.02, 226, 227, 229, 365/230.01, 230.03
See application file for complete search history.

(56) References Cited

U.S. PATENT DOCUMENTS

| | | |
|---|---|---|
| 5,056,015 A | 10/1991 | Baldwin et al. |
| 6,338,113 B1 | 1/2002 | Kubo et al. |
| 6,618,791 B1 | 9/2003 | Dodd et al. |
| 6,834,322 B2 | 12/2004 | Sukegawa |

(Continued)

OTHER PUBLICATIONS

International Search Report and Written Opinion for related PCT Application No. PCT/US2012/028049 mailed Sep. 25, 2012, (14 pgs.).

(Continued)

*Primary Examiner* — Fernando Hidalgo
(74) *Attorney, Agent, or Firm* — Brooks, Cameron & Huebsch, PLLC

(57) ABSTRACT

Apparatuses and methods of operating memory are described. One such method can include receiving a select command at a plurality of memory volumes of a memory device, the select command indicating a targeted memory volume of the plurality of memory volumes. In response to the select command, the method can include selecting the targeted memory volume of the memory volumes and putting at least a portion of a non-selected memory volume of the memory volumes in a particular state based, at least in part, on a previous state of the non-selected memory volume and/or a portion of an address associated with the select command.

18 Claims, 6 Drawing Sheets

(56) References Cited

U.S. PATENT DOCUMENTS

| | | |
|---|---|---|
| 7,269,082 B2 | 9/2007 | Naito |
| 7,755,947 B2 | 7/2010 | Fujita et al. |
| 7,778,057 B2 | 8/2010 | McCarthy et al. |
| 7,831,742 B2 | 11/2010 | Bernardi |
| 7,864,622 B2 | 1/2011 | Sohn et al. |
| 8,462,536 B2 | 6/2013 | Nobunaga et al. |
| 8,787,086 B1 | 7/2014 | Clark et al. |
| 2001/0003837 A1 | 6/2001 | Norman et al. |
| 2008/0140916 A1 | 6/2008 | Oh et al. |
| 2008/0155287 A1* | 6/2008 | Sundaram ............... G11C 16/30 713/322 |
| 2008/0320214 A1 | 12/2008 | Ma et al. |
| 2009/0089536 A1* | 4/2009 | Norman ............... G06F 13/1694 711/200 |
| 2010/0082884 A1 | 4/2010 | Chen et al. |
| 2010/0174851 A1 | 7/2010 | Leibowitz et al. |
| 2010/0246280 A1 | 9/2010 | Kanda |
| 2010/0259980 A1 | 10/2010 | Futatsuyama |
| 2012/0042148 A1 | 2/2012 | Grunzke |
| 2012/0109896 A1 | 5/2012 | Abraham et al. |
| 2012/0110244 A1 | 5/2012 | Feeley et al. |
| 2012/0170400 A1 | 7/2012 | Tu |
| 2012/0233380 A1 | 9/2012 | Butterfield |
| 2012/0233433 A1 | 9/2012 | Grunzke |
| 2012/0278533 A1* | 11/2012 | Suzuki ............... G11C 16/3404 711/103 |
| 2013/0083611 A1 | 4/2013 | Ware et al. |
| 2013/0254585 A1 | 9/2013 | Zerbe et al. |
| 2014/0233340 A1 | 8/2014 | Liang |

OTHER PUBLICATIONS

Grunzke, ONFI 3.0 The Path to 400MT/s NAND Interface Speeds, Flash Memory Summit, Santa Clara, California, http://www.flashmemorysummit.com/English/Collaterals/Proceesings/2010/20100818_S104_Grunzke.pdf, accessed from web-site Jan. 20, 2010 (17 pgs.).

ONFI Workgroup, Open NAND Flash Interface Specification Revision 3.0, ONFI Workgroup, Published Mar. 15, 2011(288 pgs.).

* cited by examiner

VOLUME SELECT FOR AFFECTING A STATE OF A NON-SELECTED MEMORY VOLUME

PRIORITY INFORMATION

This application is a Divisional of U.S. application Ser. No. 13/935,318, filed Jul. 3, 2013, which issues as U.S. Pat. No. 9,117,504 on Aug. 25, 2015, the contents of which are included herein by reference.

TECHNICAL FIELD

The present disclosure relates generally to semiconductor memory apparatuses and methods, and more particularly, to apparatuses and methods of operating memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory. An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

Memory systems can include a number of discrete memory devices (e.g., packages), which can be multi-chip packages (MCPs), and a memory system itself can be considered a memory device. A MCP can include a number of memory dies and/or chips each having a number of memory units associated therewith. The memory units can execute commands received from a host, report status to the host, and can include a number of memory arrays along with peripheral circuitry. The memory arrays can include memory cells that can be organized into a number of physical groups (e.g., blocks), with each of the groups capable of storing multiple pages of data.

In various memory systems, multiple memory devices are coupled to a controller via a shared bus. The controller can regulate performance of various operations such as erase operations, program operations, and read operations, for example. The interaction between the controller and the multiple memory devices can affect various characteristics of a memory system including power consumption, processing speed, and/or data integrity, among other memory system characteristics.

DETAILED DESCRIPTION

Figure 1:
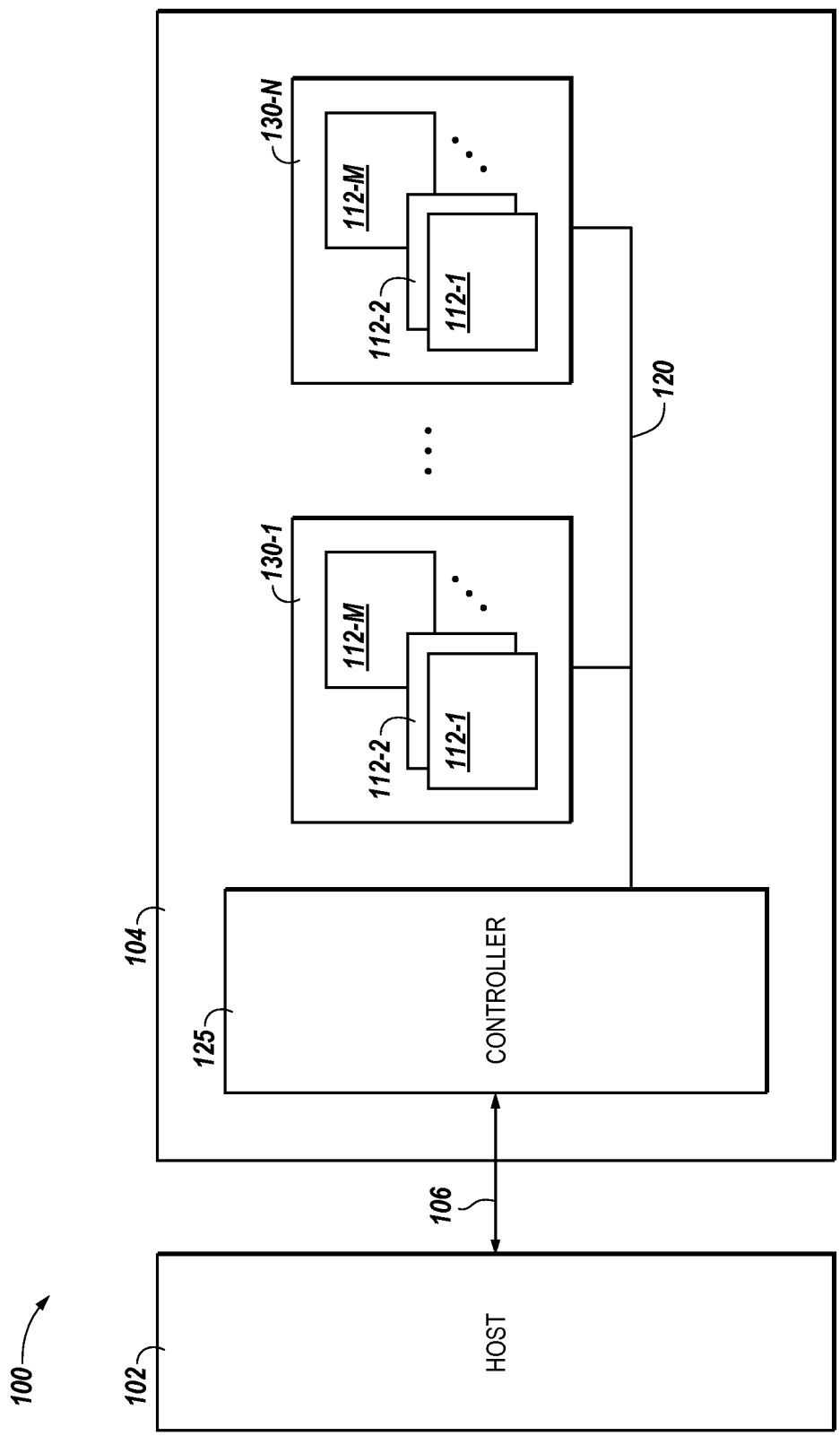
FIG. 1 is a block diagram of an apparatus in the form of a computing system including a memory system configured to operate memory in accordance with a number of embodiments of the present disclosure.

The present disclosure includes apparatuses and methods of operating memory. One such method can include receiving a select command at a plurality of memory volumes of a memory device, the select command indicating a targeted memory volume of the plurality of memory volumes. In response to the select command, the method can include selecting the targeted memory volume of the memory volumes and putting at least a portion of a non-selected memory volume of the memory volumes in a particular state (e.g., a reduced power state) based, at least in part, on a previous state of the at least portion of the non-selected memory volume.

Embodiments of the present disclosure can provide various benefits such as reducing interaction between a controller and memory devices coupled to the controller via a shared bus in association with various memory operations as compared to prior memory systems, devices, and methods, among other benefits. As an example, reducing the interaction between the controller and the memory devices can reduce power consumption associated with operating the memory system.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As used herein, "a number of" something can refer to a number of such things.

FIG. 1 is a block diagram of an apparatus in the form of a computing system 100 including a memory system 104 configured to operate memory in accordance with a number of embodiments of the present disclosure. As used herein, a memory system 104, a controller 125, or a memory device 130-1, ..., 130-N might also be separately considered an "apparatus". The memory system 104 can be a number of solid state drives (SSDs) and can include a host interface 106, a controller 125 (e.g., a processor and/or other control circuitry, firmware, and/or software), and a plurality memory devices 130-1, ..., 130-N (e.g., solid state memory devices such as NAND flash devices) which provide a storage volume for the memory system 104. The memory system 104 can be communicatively coupled to a host 102 via a host interface 106, such as a backplane or bus. In a number of embodiments, the controller 125 can be an application specific integrated circuit (ASIC) coupled to a printed circuit board.

Examples of hosts 102 can include laptop computers, personal computers, digital cameras, digital recording and playback devices, mobile telephones, PDAs, memory card readers, and interface hubs, among other host systems. The host interface 106 can include a serial advanced technology attachment (SATA), peripheral component interconnect express (PCIe), or a universal serial bus (USB), among other connectors and interfaces. In general, however, host interface 106 can provide an interface for passing control, address, data, and other signals between the memory system 104 and the host 102.

Host 102 can include a number of processors (e.g., parallel processors, co-processors, etc.) communicatively coupled to a memory and bus control. The number of processors can be a number of microprocessors, or some other type of controlling circuitry, such as a number of application-specific integrated circuits (ASICs), for example. Other components of the computing system 100 may also have processors. The memory and bus control can have memory and other components directly communicatively coupled thereto, for example, dynamic random access memory (DRAM), graphic user interface, and/or other user interface (e.g., display monitor, keyboard, mouse, etc.).

The memory system 104 includes a bus 120 to send/receive various signals (e.g., data signals, control signals, and/or address signals), between the memory devices 130-1, ..., 130-N and the controller 125. Although the example illustrated in FIG. 1 includes a single bus 120, the memory system 104 can include a separate data bus (DQ bus), control bus, and address bus, in some embodiments. The bus 120 is shared by the plurality of memory devices 130-1, ..., 130-N and can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The bus 120 can be a hardwired shared physical bus, for instance.

The memory system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

As illustrated in FIG. 1, the memory devices 130-1, ..., 130-N can comprise a number of dies and/or chips that can include a number of memory units 112-1, 112-2, ..., 112-M providing a storage volume for the memory system 104. The memory units 112-1, 112-2, ..., 112-M can be referred to as logical units (LUNs) and can include a number of memory arrays and/or peripheral circuitry thereon. In a number of embodiments, the memory units 112-1, 112-2, ..., 112-M can be the minimum component of memory system 104 capable of independently executing commands from and/or reporting status to the controller 125 and/or host 102 via bus 120. The memory units 112-1, 112-2, ..., 112-M can include Flash memory arrays having a NAND architecture, for example. However, embodiments are not limited to a particular type of memory array or array architecture.

As described further below in connection with FIGS. 2-4, in a number of embodiments, the memory units 112-1, 112-2, ..., 112-M within the memory devices 130-1, ..., 130-N can be organized into a plurality of memory volumes. For instance, each memory volume can be a set of a number of memory units that share an enable signal (e.g., a chip enable (CE) signal received from the controller 125) within one of the memory devices 130-1, ..., 130-N. For instance, a plurality of enable terminals (e.g., pins) associated with the memory devices 130-1, ..., 130-N can be coupled together and may be coupled to one enable terminal (e.g., pin) of the memory controller 125. As such, a single chip enable signal of the controller 125 may be shared by a plurality of the memory devices 130-1, ..., 130-N, in various embodiments.

The state of a chip enable signal can be used to activate/deactivate a memory unit. For example, a memory system can be configured such that memory units are active low (e.g., the memory units can process commands received from the controller when the chip enable signal is in a low state). For active low memory units, the memory units become inactive (e.g., deselected) and cannot process all commands when the chip enable signal is in a high state. Embodiments of the present disclosure are not limited to memory units having a particular chip enable configuration. As used herein, activating a memory unit can include activating a memory volume and/or a memory device associated with a memory unit.

A command can be provided to the memory volume(s), in a number of embodiments. The command can include a select command which can be received by the memory volume(s), and can indicate a target memory volume(s) to be selected. A command indicating a target memory volume(s) to be selected, as used herein, can refer to, for example, an indication in an address associated with the command, however, without more specificity, it may be said that the command indicates or provides the indication.

For example, the target memory volume(s) within the memory devices 130-1, ..., 130-N can have volume addresses assigned (e.g., appointed) thereto. The assigned volume addresses can be used to distinguish among memory volumes associated with a shared chip enable signal, as described further below. Accordingly, the volume address of a target memory volume to be selected can be provided to and received by the memory volume(s) in associated with the provided select command.

In various embodiments, the command can also indicate a particular state. For instance, at least a portion of a non-selected memory volume can be put in a particular state in response to the command indicating a particular state, as described further below in connection with FIGS. 2-6. A command indicating a particular state, as used herein, can refer to, for example, an indication in an address associated with the command, however, without more specificity, it may be said that the command indicates or provides the indication. For example, the indication can be in what is conventionally a reserved bit of a volume address associated with a select command. In some embodiments, an address associated with the command can indicate which non-selected memory volumes and/or portions thereof to put in a first state (e.g., a first reduced power state) and/or a second state (e.g., second reduced power state) based, at least in part, on a mapping of conventionally reserved (e.g., unused according to the current specification) bits of the address associated with the command to the memory volumes (e.g., as discussed further with regard to FIG. 5).

Figure 2:
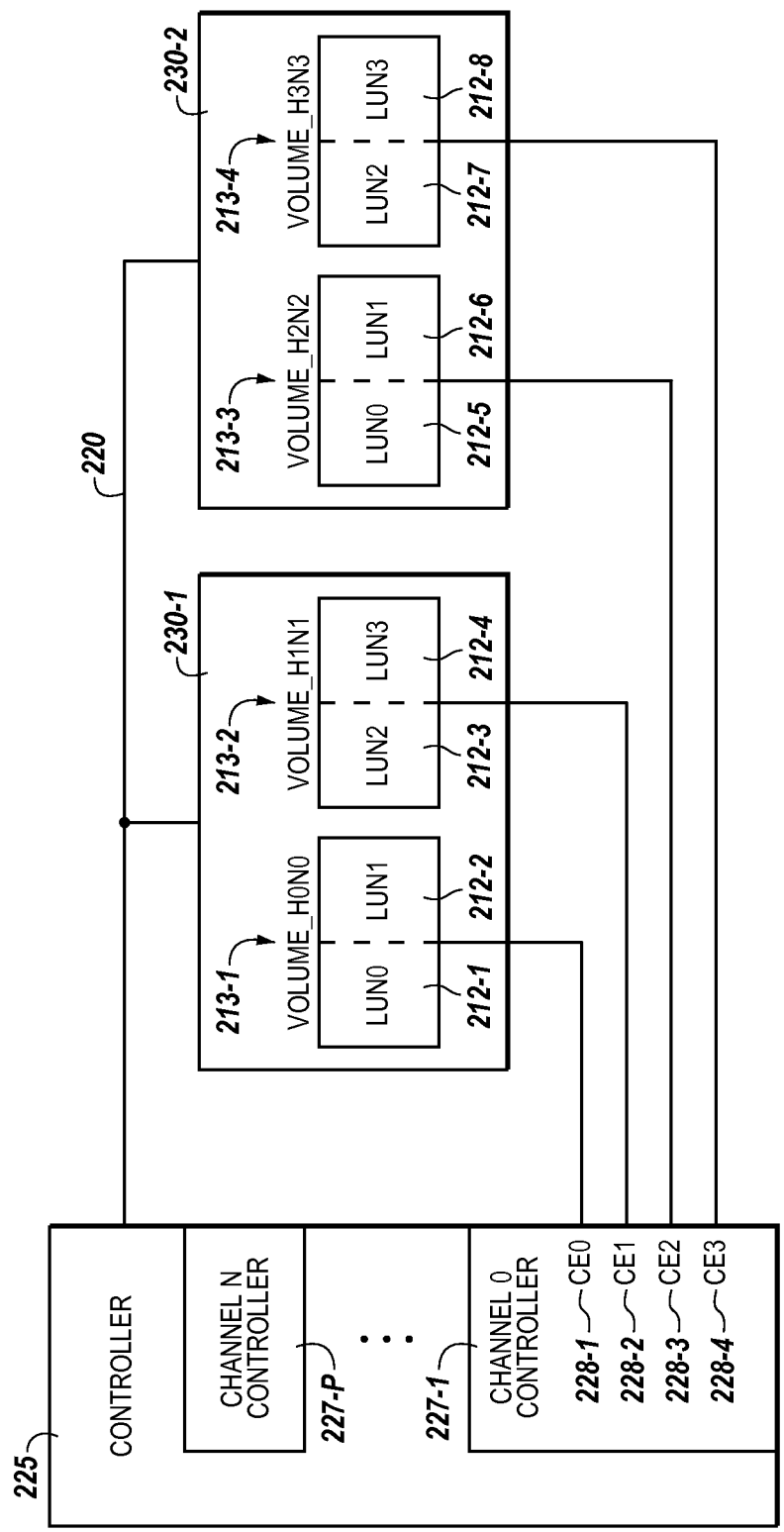
FIG. 2 is a block diagram of a portion of an apparatus in the form of a computing system including a memory system configured to operate memory in accordance with a number of embodiments of the present disclosure.

FIG. 2 is a block diagram of a portion of an apparatus in the form of a computing system including a memory system configured to operate memory in accordance with a number of embodiments of the present disclosure. The memory system illustrated in FIG. 2 includes a controller 225, which can be analogous to the controller 125 illustrated in FIG. 1. The controller 225 can control access across a plurality of memory channels. In this example, the controller 225 includes a plurality of channel controllers 227-1, . . . , 227-P each controlling access to a respective memory channel.

As used herein, a memory device (e.g., memory devices 230-1, 230-2) can be a number of dies and/or chips that can include a number of memory units (e.g., memory units 212-1, 212-2, 212-3, 212-4, 212-5, 212-6, 212-7, 212-8) providing a storage volume for a memory system. A memory unit, which can be referred to as a LUN, can include a number of memory arrays and/or peripheral circuitry thereon. In a number of embodiments, a memory unit can be a minimum component of a memory system capable of independently executing commands from and/or reporting status to the controller 225 and/or host via bus 220. A memory volume can be a set of a number of memory units that share an enable signal (e.g., CE signal received from the controller 225) within a memory device.

In the example shown in FIG. 2, the controller 225 is coupled to a first memory device 230-1 and a second memory device 230-2 via a bus 220 (e.g., a shared data, address, and control bus), the memory devices 230-1, 230-2 can be analogous to the memory devices 130-1, . . . 130-N illustrated in FIG. 1. Each of the memory devices 230-1, 230-2 includes 4 memory units 212-1, 212-2, 212-3, 212-4 and 212-5, 212-6, 212-7, 212-8, which may be referred to generally as memory units 212. The memory units 212 can be analogous to the memory units 112-1, 112-2, . . . , 112-M illustrated in FIG. 1. The memory units 212 can be memory die and the memory devices 230-1, 230-2 can be multi-chip packages, as an example. In this example, the memory units 212 within each memory device 230-1, 230-2 are organized (e.g., grouped) into two memory volumes, with each of the memory units of a memory volume sharing a chip enable input (e.g., a pin). A chip enable input, as used herein, can include a pin, a connection, etc. For instance, memory unit 212-1 and memory unit 212-2 comprise memory volume 213-1 and memory unit 212-3 and memory unit 212-4 comprise memory volume 213-2 within memory device 230-1. Similarly, memory unit 212-5 and memory unit 212-6 comprise memory volume 213-3 and memory unit 212-7 and memory unit 212-8 comprise memory volume 213-4 within memory device 230-2.

In this example, the controller 225 includes four CE inputs 228-1 (CE0), 228-2 (CE1), 228-3 (CE2), and 228-4 (CE3) dedicated to providing CE signals to the memory devices 230-1, 230-2. For instance, CE0 is coupled to a CE input associated with memory volume 213-1 within memory device 230-1, CE1 is coupled to a CE input associated with memory volume 213-2 within memory device 230-1, CE2 is coupled to a CE input associated with volume 213-3 within memory device 230-2, and CE3 is coupled to a CE input associated with memory volume 213-4 within memory device 230-2.

Although the CE inputs are shown separately, the controller 225 and memory devices 230-1, 230-2 have various other inputs connected via signal lines, for instance, which can be part of bus 220. Although not shown in FIG. 2, each of the channel controllers 227-1, . . . , 227-P can be coupled to a plurality of memory devices (e.g., two in this example). Embodiments are not limited to the example shown in FIG. 2. For instance, the memory system can include more or fewer than two memory devices per channel, more or fewer than two memory volumes per memory device, etc.

In the example illustrated in FIG. 2, each of the memory volumes 213-1, 213-2, 213-3, 213-4 has an assigned volume address associated therewith. As described further below in connection with FIG. 5 and FIG. 6, a command provided (e.g., issued) by the controller 225 can indicate (e.g., specify) a volume address of a memory volume targeted to receive a subsequent command (e.g., the next command) from the controller 225 (e.g., in an address provided by the controller 225 in association with the command). The command indicating the particular target memory volume address is received by each of the memory devices 230-1, 230-2 coupled to the shared bus 220.

In various embodiments, the provided command can indicate whether a memory volume and/or an associated memory unit of the memory volume not specified by the command (e.g., non-selected memory units and/or memory volumes) will be put in a particular state based, at least in part, on a previous state of the memory volume and/or the associated memory unit. The particular state can include a different state than the previous state of the memory volumes and/or associated memory units within the memory volumes, in a number of embodiments. For instance, the command can indicate a particular state in a portion of an address associated with the command (e.g., a select address). The particular state indicated in the address can include, for instance, multiple particular states, such as multiple reduced power states.

A state, as used herein, can include a mode of operation. The particular state can include a reduced power state, a state that enables warm up cycles to be issued on next data input/output cycle, and/or a state to start any internal clocks used for memory management, among other states.

Memory volumes 213-1, 213-2, 213-3, 213-4 and/or associated memory units 212 within a memory volume 213-1, 213-2, 213-3, 213-4 can be in an active state or an inactive state. An active state can be a state wherein a memory device (e.g., NAND) is on (e.g., power on) and a memory volume and/or memory unit within the memory device can process commands received from the controller 225. For instance, an active state can include ready normal (e.g., the memory volume and/or memory unit within the memory volume is ready to process commands) and/or ready active (the memory volume and/or memory unit within the memory volume is processing commands). An inactive state can be a state wherein a memory device (e.g., NAND) is on and a memory volume and/or memory unit within the memory device cannot process all commands received from the controller 225 (e.g., may process commands if a memory unit is sniffing, as discussed further herein). In a number of embodiments, an inactive state can be a reduced power state (e.g., a first reduced power state and/or a second reduced power state). That is, an inactive state can include a state that uses less power than an active state.

As used herein, putting a memory volume in a state (e.g., active or inactive) can include causing each memory unit within the memory volume to enter a state (e.g., a transition from a previous state to the particular state). For instance, when a particular memory volume is put in an active state, a memory unit(s) within the memory volume enters into an active state and can process commands. When a particular memory volume is put in inactive state, a memory unit(s) within the memory volume enters into a reduced power state and cannot process all commands.

A reduced power state, as used herein, can include a first reduced power state, a pseudo reduced power state, and/or a second reduced power state. A first reduced power state can be a state in which the memory volume and/or a number of memory units of a memory volume cannot process all commands, and page buffers and input buffers of the memory volume and/or a number of memory units of the memory volume are deactivated. A pseudo reduced power state can be a state in which page buffers of the memory unit(s) are deactivated (inactivated page buffers) and input buffers of the memory unit(s) are activated (activated input buffers). A second reduced power state can be a state in which the memory volume and/or a number of memory units of a memory volume cannot process all commands and page buffers of the memory unit and/or number of memory units of a memory volume are activated. An example second reduced power state can include a "snooping" state (which may be referred to as a "sniff" state) (e.g., as discussed further below in connection with FIG. 5), for example. The first reduced power state can include a power state that is lower in power (e.g., uses less power) than the second reduced power state, and the first reduced power state and the second reduced power state can be power states that are lower in power than an active state. The pseudo reduced power state can include a power state that is higher in power (e.g., uses more power) than the first reduced power state and lower in power than the second reduced power state.

The reduced power states can have a tradeoff in power reduction as compared to latency (e.g., time delay to activate at least a portion of a memory volume that is in a reduced power state). For instance, a transition from a first reduced power state to an active state can include a greater amount of time than a transition from a second reduced power state to an active state. A user (e.g., a system designer) can use this power reduction verses latency tradeoff based, at least in part, on a probability of access to designate which unselected memory volumes and/or portions of unselected memory volumes to put in a first reduced power state (e.g., by bringing the CE signal low) and/or a second reduced power state (e.g., by bringing and/or keeping the CE signal high, as discussed further below).

For example, a select command can be provided to a plurality of memory volumes 213-1, 213-2, 213-3, 213-4 of the memory devices 230-1, 230-2. The select command can indicate a target memory volume, for instance. The memory volume specified by the select command can remain (e.g., be kept) active (e.g., memory unit(s) of the target memory volume indicated by the select command remain active). At least portions of the unselected memory volume(s) can be put in a particular state (e.g., a first reduced power state) in response to the select command indicating a particular state (e.g., memory units associated with the unselected memory volumes can be put in a particular state).

As an example, in response to the select command indicating a reduced power state, a non-selected memory volume can be put in a first reduced power state based, at least in part, on the previous state of the non-selected memory volume being in an active state. For instance, a non-selected memory volume with a CE signal low (CE_low) can be put in a first reduced power state. A non-selected memory volume can be put in a second reduced power state, for instance, based, at least in part, on the previous state of the non-selected memory volume being an inactive state. As an example, a non-selected memory volume with a CE signal high (e.g., CE_high), can be put in (e.g., revert to) a second reduced power state. Thereby, a user (e.g., a system designer) can designate at least a portion of a particular memory volume to enter a first reduced power state by bringing a CE signal associated with the particular memory volume low prior to issuing a select command. The user can designate at least a portion of a particular memory volume to enter a second reduced power state by bringing a CE signal associated with the particular memory volume high prior to issuing a select command.

In various embodiments, a terminator memory unit of the non-selected memory volume put in a reduced power state can be put in a pseudo reduced power state. By putting (e.g., placing) the terminator memory unit in a pseudo reduced power state (e.g., deactivated page buffers and active input buffers), the terminator memory unit can perform on die termination (ODT) (e.g., as discussed further below in connection with FIGS. 4 and 6).

Figure 3:
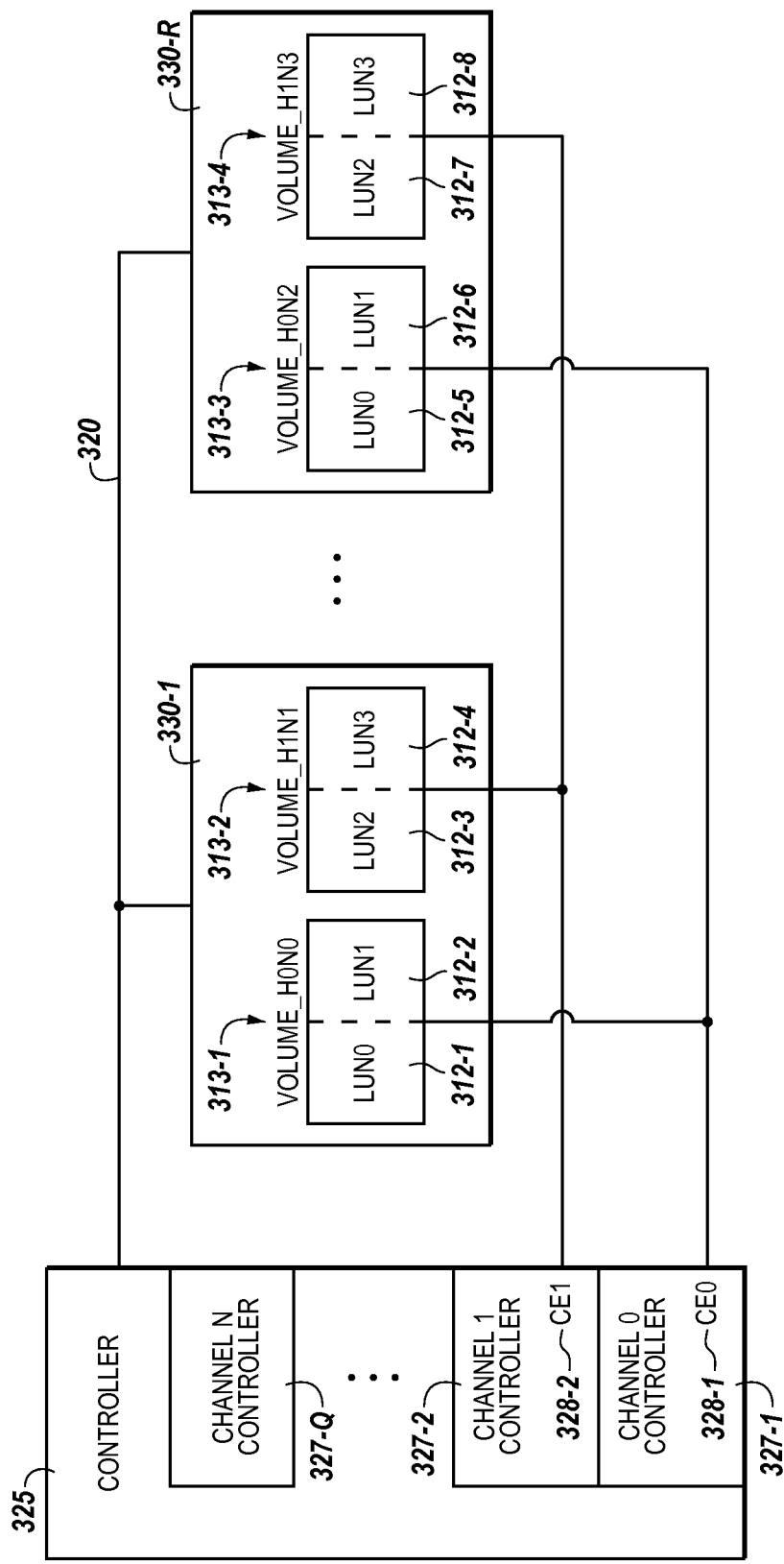
FIG. 3 is a block diagram of a portion of an apparatus in the form of a computing system including a memory system configured to operate memory in accordance with a number of embodiments of the present disclosure.

FIG. 3 is a block diagram of a portion of an apparatus in the form of a computing system including a memory system configured to operate memory in accordance with a number of embodiments of the present disclosure. The embodiment illustrated in FIG. 3 can provide reduced input (e.g., pin) counts as compared with the memory system illustrated in FIG. 2. The memory system illustrated in FIG. 3 includes a controller 325, which can be analogous to the controller 125 illustrated in FIG. 1. The controller 325 can control access across a plurality of memory channels. In this example, the controller 325 includes a plurality of channel controllers 327-1, 327-2, ..., 327-Q each controlling access to a respective memory channel. The channel controllers 327-1, 327-2, ..., 327-Q can be analogous to the channel controllers 227-1, ..., 227-P illustrated in FIG. 2.

In the example shown in FIG. 3, the controller 325 is coupled to a plurality of memory devices 330-1, ..., 330-R (which can be analogous to the memory devices 130-1, ..., 130-N illustrated in FIG. 1) via a bus 320 (which can be analogous to the bus 120 illustrated in FIG. 1). In this embodiment, each of the memory devices 330-1, ..., 330-R includes 4 memory units 312-1, 312-2, 312-3, 312-4 and 312-5, 312-6, 312-7, 312-8, which may be referred to generally as memory units 312. Similar to the system described in FIG. 2, in this example, the memory units 312 (which can be analogous to the memory units 112-1, 112-2, . . . , 112-M illustrated in FIG. 1) within each memory device 330-1, . . . , 330-R are organized into two memory volumes, with each of the memory units of a memory volume sharing a chip enable input (e.g., pin). For instance, memory unit 312-1 and memory unit 312-2 comprise memory volume 313-1 and memory unit 312-3 and memory unit 312-4 comprise memory volume 313-2 within memory device 330-1. Similarly, memory unit 312-5 and memory unit 312-6 comprise memory volume 313-3 and memory unit 312-7 and memory unit 312-8 comprise memory volume 313-4 within memory device 330-R. The memory volumes 313-1, 313-2, 313-3, 313-4 can be analogous to the memory volumes 213-1, 213-2, 213-3, 213-4 illustrated in FIG. 2.

In this example, the controller 325 includes two CE inputs 328-1 (CE0), 328-2 (CE1) dedicated to providing CE signals to the memory devices 330-1, . . . , 330-R. For instance, CE0 is coupled to a CE input associated with memory volume 313-1 within memory device 330-1 and a CE input associated with memory volume 313-3 within memory device 330-R. Also, CE1 is coupled to a CE input associated with memory volume 313-2 within memory device 330-1 and a CE input associated with memory volume 313-4 within memory device 330-R. As such, a single chip enable signal provided via a single chip enable input of the controller 325 can be shared by multiple memory volumes across a plurality of memory devices coupled to a common bus 320. The CE inputs 328-1, 328-2 can be analogous to the CE inputs 228-1, 228-2, 228-3, 228-4 illustrated in FIG. 2.

In various embodiments, the provided command can indicate whether at least a portion of a memory volume not specified by the command (e.g., non-selected memory volumes and/or memory units) will be put in a particular state based, at least in part, on a previous state of the at least portion of the memory volume(s) (e.g., based on a CE signal) and/or based, at least in part, on a bit-map of the memory volumes in an address associated with the command. For instance, the command can indicate a particular state and/or a bit-map of the memory volumes in a portion of an address associated with the command (e.g., a volume address of the command). The particular state indicated by the command can include, for instance, multiple reduced power states (e.g., a first reduced power state and a second reduced power state). For example, a targeted memory volume of the memory volumes can be selected and the unselected memory volumes can be put in a reduced power state (e.g., a first reduced power state and/or a second reduced power state) using shared CE inputs (e.g., resulting in a reduction in signals provided) and a single select command (e.g., resulting in a reduction of commands provided to select a power state of each memory unit). For example, some previous approaches may have used a separate signal and/or command for each memory unit and/or memory volume to put the memory unit(s) and/or memory volume(s) in a reduced power state.

Figure 4:
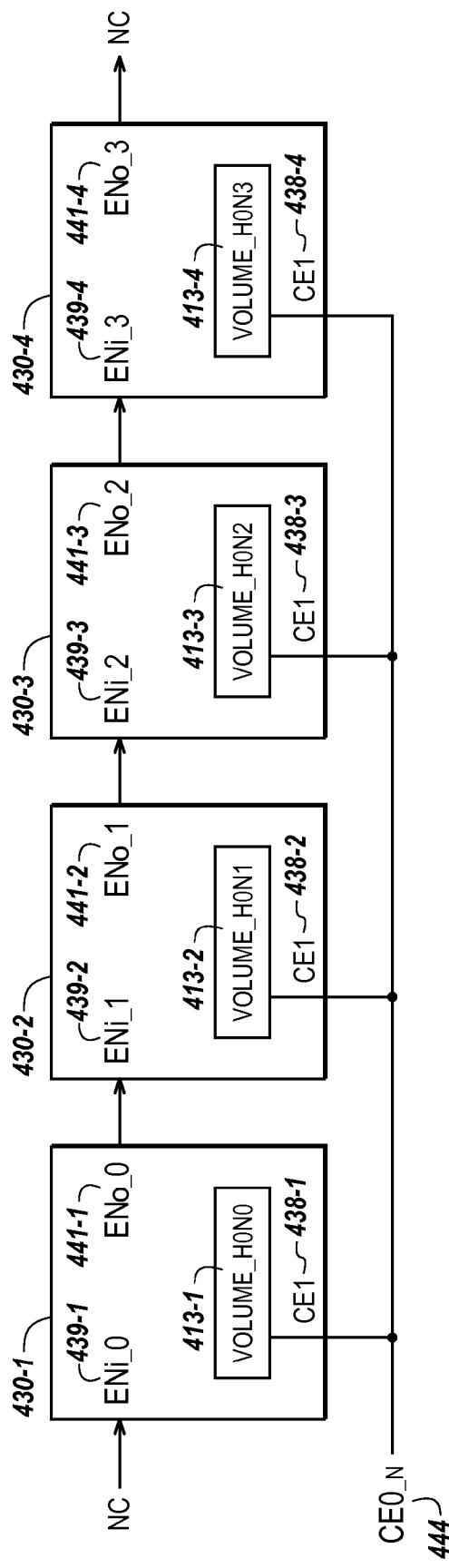
FIG. 4 is a block diagram of a portion of an apparatus in the form of a computing system including a memory system configured to operate memory in accordance with a number of embodiments of the present disclosure.

FIG. 4 is a block diagram of a portion of an apparatus in the form of a computing system including a memory system configured to operate memory in accordance with a number of embodiments of the present disclosure. The embodiment illustrated in FIG. 4 includes a plurality of memory devices 430-1, 430-2, 430-3, and 430-4 (which can be analogous to the memory devise 130-1, . . . , 130-N illustrated in FIG. 1) and illustrates an example topology (e.g., chain topology) for operating memory in accordance with a number of embodiments of the present disclosure. The memory devices 430-1, 430-2, 430-3, and 430-4 can each be single memory volume devices; however, embodiments are not so limited.

In the example illustrated in FIG. 4, each of the memory devices 430-1, 430-2, 430-3, and 430-4 includes an input pin 439-1, 439-2, 439-3, 439-4 (which may be referred to generally as input pins 439) and an output pin 441-1, 441-2, 441-3, 441-4 (which may be referred to generally as output pins 441). For instance, memory device 430-1 includes input pin 439-1 (ENi_0) and output pin 441-1 (ENo_0), memory device 430-2 includes input pin 439-2 (ENi_1) and output pin 441-2 (ENo_1), memory device 430-3 includes input pin 439-3 (ENi_2) and output pin 441-3 (ENo_2), and memory device 430-4 includes input pin 439-4 (ENi_3) and output pin 441-4 (ENo_3).

As illustrated, the input pins 439 and output pins 441 of the memory devices 430-1, 430-2, 430-3, and 430-4 can be coupled to create a chain topology. In this example, the input pin 439-1 of the first device 430-1 in the chain and the output pin 441-4 of the last device 430-4 in the chain are not connected (NC). The input pins 439 of the other devices are connected to the output pin 441 of the previous device in a chain topology as shown in FIG. 4. Embodiments of the present disclosure are not limited to the topology illustrated in FIG. 4.

As illustrated in FIG. 4, and as described above in connection with FIG. 3, each of the memory devices 430-1, 430-2, 430-3, and 430-4 share a common CE signal (e.g., a pin) from a controller (e.g., controller 325 shown in FIG. 3). For instance, a chip enable signal 444 (CE0_N) from a controller is shared by the chip enable pin 438-1, 438-2, 438-3, 438-4 (CE1) of each of the memory devices 430-1, 430-2, 430-3, and 430-4. The chip enable pins 438-1, 438-2, 438-3, 438-4 (which may be referred to generally as chip enable pin 438) of each of the memory devices 430-1, 430-2, 430-3, and 430-4 is associated with (e.g., corresponds to) a particular memory volume 413-1, 413-2, 413-3, and 413-4 (which can be analogous to the memory volumes 213-1, 213-2, 213-3, 213-4 illustrated in FIG. 2). As described above, a memory volume can refer to a plurality of memory units (e.g., LUNs) that share a particular CE signal within a memory device. Each of the memory volumes can be assigned a respective volume address. In this example, memory volume 413-1 is assigned volume address H0N0, memory volume 413-2 is assigned volume address H0N1, memory volume 413-3 is assigned volume address H0N2, and memory volume 413-4 is assigned volume address H0N3. In a number of embodiments, the volume addresses can be assigned to particular memory volumes upon initialization of the memory system.

In operation, the states of the input pins 439 and of the chip enable pins 438 (e.g., based on the state of chip enable signal 444) determines whether the respective memory device 430-1, 430-2, 430-3, and 430-4 is able to accept all commands. For example, if the input pin 439 of a particular device is high and the CE pin 438 of the device is low, then the particular device can accept all commands. If the input pin 439 of the particular device is low and/or the CE pin 438 is high, then the device cannot accept all commands.

In a number of embodiments, a controller can provide (e.g., issue) a select command indicating a volume address of a particular target memory volume to process a number of subsequent commands. For instance, a volume select command can be provided by the controller to the plurality of memory devices 430-1, 430-2, 430-3, and 430-4 (e.g., via a shared bus) in order to select a particular target memory volume (e.g., one of memory volumes 413-1, 413-2, 413-3, 413-4) sharing a particular chip enable signal 444 from the controller. In this manner, volume addressing can be used to access particular target memory volumes of the memory devices 430-1, 430-2, 430-3, and 430-4.

In a number of embodiments, a chip enable signal (e.g., chip enable signal 444) received from a controller (via a shared bus such as shared bus 320 shown in FIG. 3) is used to activate a plurality of memory volumes within memory devices (e.g., memory devices 430-1, 430-2, 430-3, and 430-4). For example, assuming the memory units in memory devices 430-1, 430-2, 430-3, and 430-4 are active low, they can be activated responsive to detecting the chip enable signal 444 switching from a first state to a second state (e.g., from a high to a low state).

A select command can subsequently be provided to the activated plurality of memory volumes 413-1, 413-2, 413-3, 413-4 in memory devices 430-1, 430-2, 430-3, and 430-4. In a number of embodiments, the select command can indicate (e.g., via a volume address) a targeted memory volume of the plurality of memory volumes 413-1, 413-2, 413-3, 413-4 within a particular one of the plurality of memory devices 430-1, 430-2, 430-3, and 430-4. The targeted memory volume indicated by the command remains (e.g., is kept) active (e.g., selected) and, if the targeted memory volume was active in its previous state, the unselected (e.g., remaining) memory volumes can be put in (e.g., revert to) their previous states (e.g., their respective previous states prior to activation responsive to detecting the switching of the chip enable signal) and/or are put in a reduced power state (e.g., a first reduced power state or a second reduced power state) based, at least in part, on the respective previous state of the unselected memory volumes.

If the command received subsequent to activation responsive to switching of the chip enable signal does not indicate a target memory volume (e.g., the command is not a volume select command), then each of the memory devices 430-1, 430-2, 430-3, and 430-4 and memory volumes therein are put in (e.g., revert to) their previous states. As such, a previously selected one of the plurality of memory volumes (e.g., the memory volume which was selected prior to switching of the enable signal) will remain selected. Also, those memory volumes which were previously unselected will revert to an unselected state. The unselected state may include, for example, an inactive state. For instance, an inactive state can include a reduced power state, such as a first reduced power state and/or a second reduced power state. In various embodiments, a second reduced power state can be a "snooping" state (which can be referred to as a sniff state) (e.g., if an on die termination function is enabled). On die termination (ODT) refers to the use of a number of memory units (e.g., die) to perform termination for a number of signal lines of a shared bus. ODT can improve signal integrity associated with signals across shared busses.

As an example, a memory unit can be assigned as a terminator for a particular memory volume such that the memory unit performs termination functions when the target memory volume is selected. When a target memory volume is selected, the memory unit assigned as a terminator for that target memory volume can enter a sniff state in which the memory unit monitors commands provided to the selected memory volume. The memory unit assigned as a terminator can activate upon detection of a particular operation (e.g., a read command, a write command, etc.) in order to perform a termination function. The memory unit can then return to a sniff state such that it does not remain active. Maintaining memory units in a sniff state can reduce system power usage as compared to maintaining the memory units in an active state, among other benefits.

In various embodiments, a memory unit assigned as a terminator for a target memory volume can be a portion of a different memory volume than the target memory volume. In such an instance, when the target memory volume is selected (e.g., selected using a select command), the terminator for the target memory volume can be a portion of an unselected memory volume. Terminators that are a portion of unselected memory volumes (e.g., unselected terminators) can be put in a pseudo reduced power state, in various embodiments. For instance, responsive to the select command indicating a reduced power state, unselected memory volumes can be put in a reduced power state (e.g., a first reduced power state) and terminators within the unselected memory volumes can be put in the pseudo reduced power state. A pseudo reduced power state can include deactivated page buffers with active input buffers. Thereby, a terminator in a pseudo reduced power state can perform ODT.

Figure 5A:
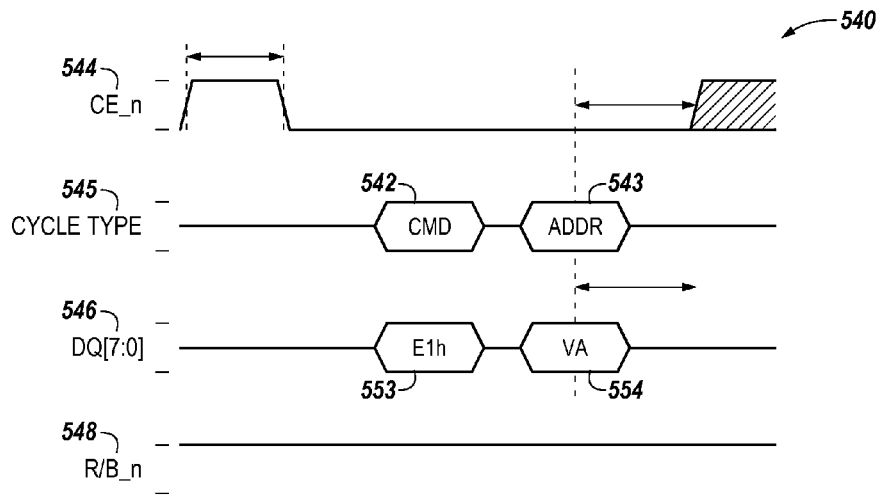
FIGS. 5A-5B are illustrations of a timing diagram including a select command in accordance with a number of embodiments of the present disclosure.
Figure 5B:
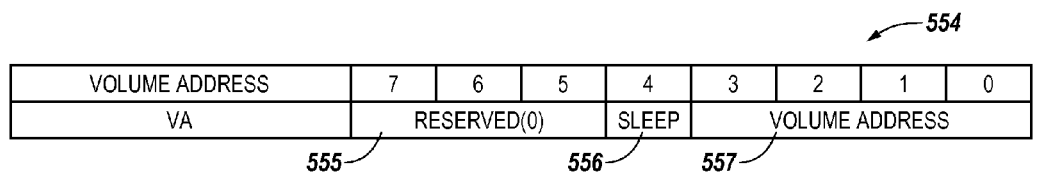

FIGS. 5A-5B are illustrations of a timing diagram 540 including a select command 553 in accordance with a number of embodiments of the present disclosure. FIG. 5A, for instance, illustrates a timing diagram 540.

The timing diagram 540 includes a chip enable signal 544, a representation of the cycle type 545, a representation of data that can be provided to a memory device (e.g., in the form of a command, such as select command 553, and/or address data, such as volume address 554, among others), across an input/output (I/O) port 546 (e.g., DQ strobe), and a ready busy signal 548.

The ready busy (R/B) signal 548 can indicate the status of a memory unit. An R/B signal can be, in a number of embodiments, a separate signal per memory unit within a memory volume. However, in some embodiments, a number of memory units can share an external R/B signal. When any one of the memory units that shares the external R/B signal is busy, the external R/B signal indicates that one or more of the plurality memory units are busy (e.g., as discussed further below). The external R/B signal can be shared across memory devices, memory volumes, and/or a number of memory units. For instance, a shared external R/B signal of a memory device can indicate the status of memory volumes and memory units within the memory device, a shared external R/B signal of a memory volume can indicate the status of the memory units within the memory volume, and an external R/B signal to a memory unit can indicate the status of the memory unit. Each memory unit has a Status Byte that is provided when a Status Read command (e.g., 70*h* or 78*h*) is issued and a status register "SR" bit (e.g., status bit 6) can specify what the R/B signal is for an individual memory unit.

When an external R/B signal is low, Array operations are in progress for memory volume and/or a number of memory units (e.g., LUN). When an external R/B signal is high, the signal indicates the memory volume and/or number memory units are ready. However, if the external R/B signal 548 is high and cache operation is in progress (e.g., status register "SR" is busy), the memory volume and/or number of memory units are still in a busy state. The chip enable signal 544 activates the corresponding memory volumes. For instance, a memory device including a plurality of memory volumes can be activated by switching the chip enable signal 544 to the plurality of memory volumes from a first state to a second state (e.g., from high to low). A memory volume and/or memory unit with an external ready busy signal that indicates the memory volume and/or memory unit is ready (e.g., R/B high), will process many commands (e.g., including a volume select command). When the external ready busy signal indicates the memory volume and/or memory unit is not ready (e.g., R/B low), some commands may be accepted (e.g., received and later processed, as discussed below).

For instance, a memory volume with a CE signal 544 low can be in an active state. If the active memory volume and/or memory unit within the memory volume is in a ready state, the memory volume and/or memory unit can process a command (e.g., such as volume select command). If the active memory volume and/or a memory unit within the memory volume is in a busy state, the memory volume and/or memory unit may accept the command (e.g., volume select command) but may not process the command until the memory volume and/or memory unit is ready (e.g., R/B goes high). A memory volume with a CE signal 544 high can be in an inactive state and may be unable to accept and/or process all subsequent commands (e.g., until the chip enable signal is switched to low). For instance, a memory volume with a CE signal 544 high can enter a second reduced power state (e.g., input buffers off, page buffers on, and unable to process commands, unless for sniffing).

A command cycle 542 can be provided to an active memory volume and/or memory device. A cycle type 545 can indicate a command cycle 542, address cycle 543, or data to be issued by the controller. The select command 553, as illustrated in FIG. 5, can include a command code (e.g., E1h illustrated in the select command 553) followed by a volume address "VA" 554. In some embodiments, the volume address 554 can be transmitted in a number of address cycles (e.g., address cycle 543).

FIG. 5B is an illustration of a volume address 554 in accordance with a number of embodiments of the present disclosure. The volume address 554 illustrated in FIG. 5B can include the volume address 554 illustrated in FIG. 5A, for instance.

In various embodiments, the volume address 554 can include a first portion 557 indicating a target memory volume among a plurality of memory volumes (e.g., a volume address of the target memory volume) and a second portion 556 indicating whether at least a portion of the non-selected memory volume(s) will be put in a particular state (e.g., a reduced power state) based, at least in part, on a previous state of the at least portion of the non-selected memory volume(s).

For example, a plurality of memory volumes of a memory device can be activated by switching a chip enable signal (e.g., CE_n 544 illustrated in FIG. 5A) from high to low. A subsequent command can be provided to the activated memory volumes and/or memory device. The command can be a select command (e.g., select command 553 illustrated in FIG. 5A) indicating a target memory volume of the plurality of memory volumes to remain in an active state based, at least in part, on a volume address of the targeted memory volume indicated in the command (e.g., in the address cycle 543 of the command as illustrated in FIG. 5A).

Further, the command can indicate whether to put the unselected memory volumes and/or associated memory units within the unselected memory volumes in a particular state. The indication can be within a portion of an address associated with command (e.g., a volume address 554). For instance, the volume address 554 can include a volume address of the targeted memory volume 557 and conventionally reserved (e.g., unused according to the current specification) bits 555, 556. A number of the conventionally reserved bits 555, 556 can be used to indicate whether to put the unselected memory volumes in the particular state (e.g., as illustrated by Sleep 556). For instance, when a chip enable signal is high (e.g., CE_high), the unselected memory volume can be put in a second state (e.g., second reduced power state). When chip enable signal is low (e.g., CE_low), the unselected memory volume can be put in a first state (e.g., a first reduced power state) in response to an indication of a particular state (e.g., Sleep 556) in the command (e.g., in an address associated with the command). In various embodiments, a conventionally reserved bit of the volume address 554 can be used to indicate a reduced power state (e.g., Sleep 556).

A memory volume and/or memory unit in a busy state (external R/B signal low) can be put in a particular state or not after busy is complete (e.g., external R/B signal goes high). A memory volume and/or memory unit in a busy state can accept a command (e.g., a select command) or ignore the command. For instance, when chip enable is low and the unselected memory volume and/or memory unit within the unselected memory volume has an external ready busy signal that indicates the unselected memory volume and/or memory unit is ready, the unselected memory volume and/or memory unit can be put in a first state (e.g., a first reduced power state) responsive to an indication of a particular state (e.g., reduced power state) in the command that was issued while the memory volume and/or memory unit was busy. When chip enable is high and the unselected memory volume and/or memory unit within the unselected memory volume has an external ready busy signal that indicates the unselected memory volume and/or memory unit is ready, the unselected memory volume and/or memory unit can be put in a second state (e.g., a second reduced power state) responsive to the chip enable signal being brought from low to high while the unselected memory volume and/or memory unit was busy. That is, a busy non-selected memory volume and/or memory unit can see a command (e.g., a volume select command) and can enter a particular state after finishing Array operations or can remain in an active state.

In some embodiments, a first portion of the unselected memory volumes and/or memory units (e.g., non-selected) can be put in a first state (e.g., a first reduced power state) and a second portion of the unselected volumes and/or memory units can be put in a second state (e.g., a second reduced power state). The first portion of the unselected memory volumes and/or memory units can be based, at least in part, on the unselected memory volumes and/or memory units being in an active state (e.g., CE_low) prior to the select command being provided and the second portion of the unselected memory volumes and/or memory units can be based, at least in part, on the unselected memory volumes and/or memory units being in an inactive state (e.g., CE_high) prior to the select command being provided.

In a number of embodiments, the first portion and second portion of the unselected memory volumes and/or memory units can be based, at least in part, on a bit-map indicated in the volume address 554 of the command. For instance, the conventionally reserved bits 555, 556 and/or an additional volume address (e.g., not illustrated in FIG. 5A-5B) can be used to map each of the plurality of memory volumes and/or memory units to a bit of the volume address 554 (e.g., the conventionally reserved bits of the volume address 554 and/or the bits of the additional volume address) of the command. As an example, the volume address 554 can include an address cycle (e.g., 543 illustrated by FIG. 5A) and the additional volume address can include an additional address cycle.

The mapping can indicate the first portion of the unselected memory volumes and/or memory units to be put in the first state (e.g., first reduced power state) and/or the second portion of the unselected memory volumes and/or memory units to be put in the second state (e.g., the second reduced power state). The mapping can, for instance, include a 1:1 mapping of each of the memory volumes and/or memory units to a bit of the volume address 554 and/or can include multiple memory volumes and/or memory units mapped to a single, conventionally reserved, bit of the volume address 554. That is, the mapping in various embodiments can include a 1:1 mapping of each unselected memory volume and/or memory unit to an single bit of an volume address 554 of the command (e.g., the conventionally reserved bits of the volume address 554 and/or an additional volume address of the command) or can include a mapping of a plurality of memory volumes and/or memory units to a conventionally reserved bit of the volume address 554 of the command (e.g., all odd memory volumes/memory units mapped to conventionally reserved bit 4, all even memory volumes/memory units mapped to conventionally reserved bit 5, every third memory volume/memory unit mapped to conventionally reserved bit 6, etc.).

The first portion of the unselected memory volumes and/or memory units to be put in the first state (e.g., first reduced power state) can be based, at least in part, on a first portion of the address associated with the command (e.g., volume address). The second portion of the unselected memory volumes and/or memory units to be put in the second state (e.g., the second reduced power state) can be based, at least in part, on a second portion of the address associated with the command. The first portion and second portion of the address associated with the command can be transmitted to the plurality of memory volumes as a single select address and/or a separate select address (e.g., the first portion of the address associated with the command is transmitted as a first select address and the second portion of the address associated with the command is transmitted as a second address).

In a number of embodiments, the first portion and second portion of the unselected memory volumes and/or memory units can be based, at least in part, on a registration of the memory volumes and/or memory units at initialization of the memory device(s). For instance, the plurality of memory volumes and/or memory units associated with the plurality of memory volumes can be assigned, during initialization, to enter the particular state (e.g., the first reduced power state and/or a second reduced power state) or not when the command (e.g., select command) is issued and memory volume and/or memory unit is on a non-selected memory volume. Further, at least a portion of the memory volumes and/or memory units can be assigned to enter the particular state or not when a particular memory volume is selected. For instance, first memory volume can be assigned to enter a first reduced power state when the first memory volume is selected by a command and a second memory volume is unselected.

Figure 6:
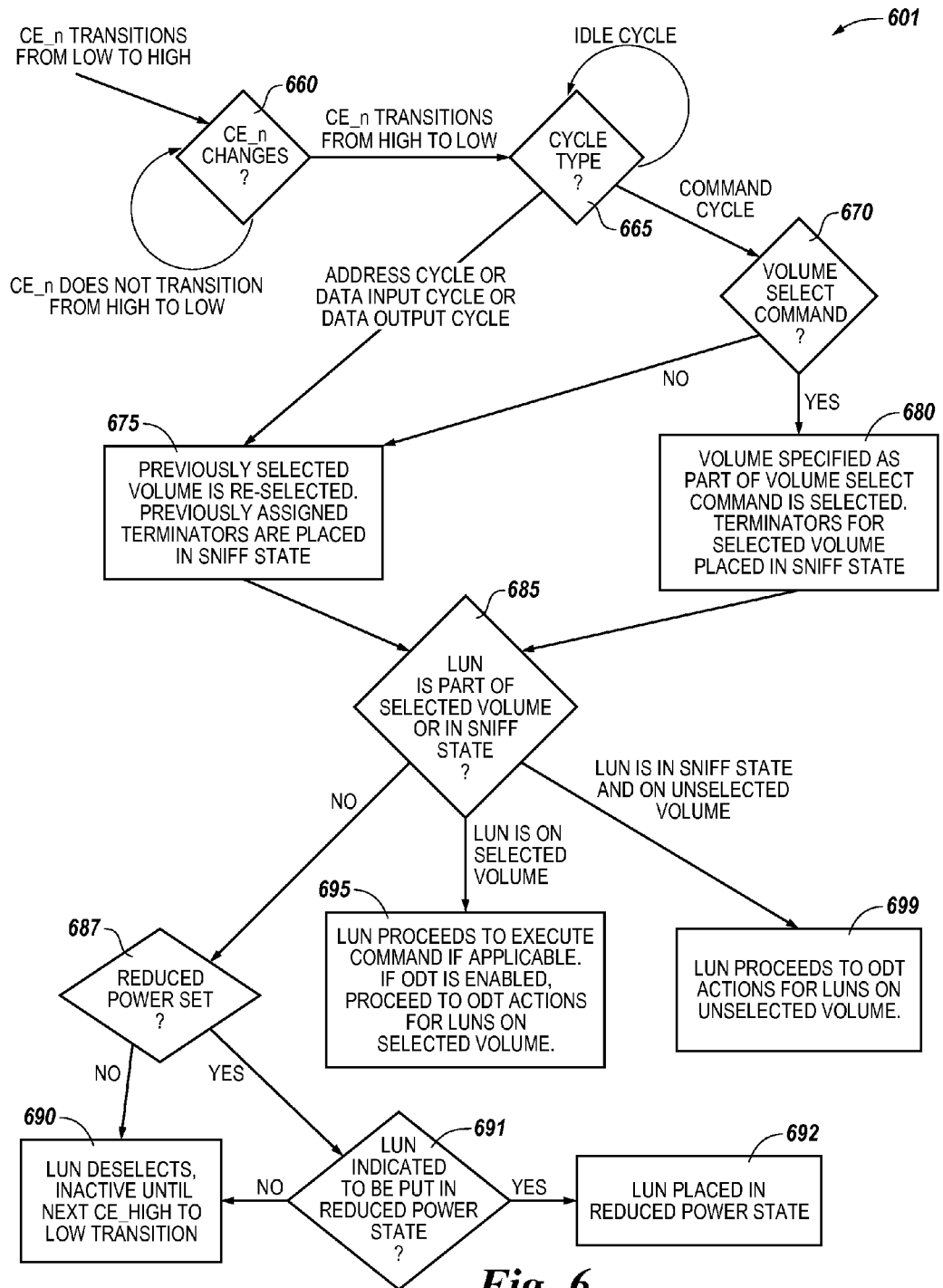
FIG. 6 is a flow chart illustrating a method of operating memory in accordance with a number of embodiments of the present disclosure.

FIG. 6 is a flow chart illustrating a method 601 of operating memory in accordance with a number of embodiments of the present disclosure. The method 601 can be applied to various memory systems such as those described above in FIGS. 1-5. As an example, the method 601 can apply to a plurality of memory devices coupled to a controller via a shared bus. In this example, the plurality of memory devices share a chip enable signal (CE_n) from the controller and are active low (e.g., the memory units of the devices activate upon detection of a low signal state of the chip enable signal). The memory units (e.g., LUNs) are each capable of independently executing commands and/or reporting status to the controller. In a number of embodiments, volume addresses can be assigned to memory volumes within the memory devices. A memory volume can include a plurality of memory units sharing a chip enable signal within a memory device (e.g., a package). In a number of embodiments, the volume addresses can be assigned to the memory volumes upon initialization of the system (e.g., upon power up). The assigned volume addresses can be maintained across reset commands, in a number of embodiments, and different volume addresses can be assigned to the memory volumes upon a subsequent system initialization.

For the method 601, the memory units sharing a chip enable signal can each enter an inactive (e.g., deselected) state from a previous state due to a transition of the shared chip enable signal from a low to high state. As an example, prior to the chip enable signal transition to the high state, one of the memory volumes (and, therefore, a plurality of memory units) on the shared bus would be active (e.g., due to a low chip enable signal received thereto) and being used by the controller (e.g., processing commands from the controller). Upon transition of the chip enable signal from the low to high state, the previously active memory volume and each unselected memory volume sharing the chip enable signal would be deactivated (e.g., enter a second reduced power state). As illustrated at block 660, the memory volumes wait for a switching of the chip enable signal from the high (e.g., inactive) to low (e.g., active) state.

As illustrated at block 665, upon detection of a switching (e.g., transition) of the chip enable signal from the high to the low state, the memory volumes sharing the chip enable signal activate and determine a cycle type (e.g., command, address, or data) of the next cycle issued by the controller. In a number of embodiments, the previously selected memory volume (e.g., the memory volume which was active and being used by the controller prior to the transition of the chip enable signal to the high state) is reselected (and the remaining memory volumes are deselected) unless the cycle is a command cycle (e.g., as opposed to an address cycle and/or a data cycle).

For instance, as illustrated at block 675, the previously selected memory volume (e.g., the memory device that includes the previously selected memory volume) is reselected responsive to the cycle type being an address cycle, data input cycle, or data output cycle. Also, as illustrated at block 675, previously assigned terminators for the reselected target memory volume are put in a sniff state. That is, since the previously selected memory volume is reselected, those memory units previously assigned as terminators for the selected volume return to their previous state, which is a sniff state. As such, the memory units assigned as terminators for the selected memory volume monitor commands provided to the selected volume and perform ODT functions in appropriate circumstances. The terminators can be a number of memory units (e.g., LUNs) within the reselected target memory volume or a number of memory units within an unselected memory volume. A terminator that is within an unselected memory volume can be put in a pseudo reduced power state in response to the address associated with the select command indicating a reduced power state (e.g., indicated using a conventionally reserved bit of the associated address and/or a bit-map using the conventionally reserved bits of the associated address and/or an additional associated address).

In the example illustrated in FIG. 6, if the cycle type is a command cycle (e.g., the controller performs a command cycle rather than an address or data cycle), then at block 670, a determination can be made as to the type of command provided by the controller. In a number of embodiments, the command provided by the controller may indicate a target memory volume (or portions of) within a particular one of the plurality of memory devices targeted to execute a number of subsequent commands received thereto. In a number of embodiments, responsive to the command not indicating a target memory volume within a particular one of the plurality of memory devices, each of the plurality of memory devices return to their previous state. In various embodiments, the subsequent command(s) provided by the controller are to be executed by a particular memory unit associated with the indicated target memory volume within one of the plurality of memory devices.

In a number of embodiments, the previously selected memory volume is reselected unless the command issued by the controller and received by the plurality of memory volumes is a particular type of command. For instance, as illustrated at block 675, the previously selected memory volume (e.g., the memory device that includes the previously selected memory volume) is reselected responsive to the command being a command other than a volume select command (e.g., a command such as a read command, write command, erase command, or other command). As used herein, a volume select command refers to a command issued by the controller that indicates a volume address of a particular target memory volume to receive a subsequent command issued by the controller (e.g., a particular target memory volume that includes the memory unit for which the subsequent command is intended). In some embodiments, the volume select command is a first command provided by the controller subsequent to activating the plurality of memory volumes via the switching of the chip enable signal from the high to the low state.

As illustrated at block 680, a particular target memory volume indicated by the command (e.g., the volume select command) is selected by the controller. As such, the selected target memory volume remains activated and the unselected (e.g., remaining) memory volumes (or portions thereof) are put in (e.g., return to) their respective previous states and/or are put in a reduced power state(s) (e.g., first reduced power state, and/or are put in a second reduced power state) in response to the command. The plurality of memory units corresponding to the selected target volume can execute subsequent commands from the controller until a subsequent deactivation of the selected target volume (e.g., due to a switching of the chip enable signal to a high state). Also, in a number of embodiments, terminators for the selected target volume that are within the selected target volume can be put in a sniff state while the selected target volume remains selected.

At block 685, the method 601 includes determining whether a memory unit is part of the currently selected target memory volume or whether the memory unit is in a sniff state. If the memory unit is not part of the currently selected target memory volume and is not in a sniff state, then as illustrated at block 687, the method 601 includes determining whether the volume select command indicates that a reduced power state is set. If the reduced power state is set, then as illustrated at block 691, the method 601 includes determining whether the memory volume that the memory unit is part of is indicated by the volume select command to be put in a reduced power state. At block 692, if the memory volume is indicated by the volume select command to be put in a reduced power state, the memory volume is put in a reduced power state (e.g., first reduced power state or second power state based on the indication) based, at least in part, on a previous state of the memory volume and/or an address associated with the select command. If the reduced power state is not set or if the memory volume is not indicated to be put in a first reduced power state (e.g., the command does not indicate a set reduced power state and/or the memory volume is not indicated to be put in a first reduced power state by an address associated with the select command and/or not assigned during initialization), then as illustrated at 690, the memory volume deselects and remains (e.g., is kept) in a second reduced power state until a next transition of the chip enable signal from the high to the low state.

If the memory unit is part of the currently selected target memory volume, then as illustrated at block 695, the memory unit proceeds to execute the command, if applicable. Also, if the memory system includes an enabled on die termination function, then appropriate ODT actions for memory units of the selected memory volume can be performed. If it is determined that the memory unit is in a sniff state and is of an unselected memory volume, then as illustrated at block 699, the memory unit can proceed to perform appropriate ODT actions for memory units on the unselected memory volume. For instance, a memory unit that is a terminator memory unit and is within an unselected memory volume can be put in a pseudo reduced power state (e.g., page buffers deactivated and input buffers activated) in response to the volume select command indicating a reduced power state and can perform appropriate ODT actions for memory units on the unselected memory volume. Embodiments of the present disclosure are not limited to the example illustrated in FIG. 6.

Although the present embodiment illustrated in FIG. 6 illustrates a particular state including reduced power states, embodiments in accordance with the present disclosure are not so limited. For instance, the first portion and the second portion of the at least a portion of unselected memory units can be put in variety of particular states.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating memory, comprising:
   receiving a select command at a plurality of memory volumes of a memory device; and
   responsive to the select command indicating a targeted memory volume of the plurality of memory volumes:
      selecting the targeted memory volume; and
      putting at least a portion of a non-selected memory volume of the plurality of memory volumes in a particular state based, at least in part, on a previous state of the at least portion of the non-selected memory volume; and
   responsive to the select command not indicating a targeted memory volume of the plurality of memory volumes, reverting each memory volume of the plurality of memory volumes to its respective state prior to an activation of each memory volume.

2. The method of claim 1, wherein receiving the select command comprises receiving a volume select command and an associated address, wherein the associated address indicates the targeted memory volume of the plurality of volumes.

3. The method of claim 1, wherein the previous state comprises an active state, and wherein the active state uses more power than the particular state.

4. The method of claim 1, wherein, putting at least the portion of the non-selected memory volume in the particular state comprises reverting the non-selected memory volume to an inactive state.

5. The method of claim 1, comprising activating the plurality of memory volumes responsive to an enable signal switching from a first state to a second state.

6. The method of claim 1, wherein selecting the targeted memory volume comprises keeping the targeted memory volume in an active state.

7. An apparatus, comprising:
   a plurality of memory devices comprising a plurality of memory volumes, wherein the apparatus is configured to:
      activate the plurality of memory volumes of the plurality of memory devices by switching a shared signal provided thereto from a first state to a second state;
      subsequently provide a command to the plurality of memory devices;
   wherein, responsive to the command indicating a targeted memory volume of the memory volumes, the targeted memory volume remains active and executes a subsequent command received;
      put at least a portion of an unselected memory volume of the plurality of memory volumes in a reduced power state based, at least in part, on a previous power state of the at least portion of the unselected memory volume
   wherein, responsive to the command not indicating any of the plurality of memory volumes as a targeted memory volume, the apparatus is configured to revert each memory volume of the plurality of memory volumes to its respective state prior to switching the shared signal.

8. The apparatus of claim 7, wherein the apparatus is configured to deactivate a memory volume of the plurality of memory volumes by switching the shared signal thereto from the second state to the first state.

9. The apparatus of claim 8, wherein the shared signal is provided from a single chip enable terminal of the apparatus to a respective chip enable terminal of each of the plurality of memory devices.

10. A method of operating memory, comprising:
    receiving a select command and an associated select address at a plurality of memory volumes of a memory device, wherein responsive to a portion of the select address indicating a targeted memory volume of the plurality of memory volumes;
       selecting the targeted memory volume responsive to the select command and the portion of the select address; and
       putting at least a portion of a non-selected memory volume of the plurality of memory volumes in a particular state based, at least in part, on a previous state of the at least portion of the non-selected memory volume; and
    responsive to the select command not indicating a targeted memory volume of the plurality of memory volumes, reverting each memory volume of the plurality of memory volumes to a respective state prior to an activation of each memory volume.

11. The method of claim 10, wherein the particular state comprises a first reduced power state; and
    wherein the method comprises putting at least a portion of a non-selected memory volume of the plurality of memory volumes of the memory device that is not activated in a second reduced power state based on the first reduced power state.

12. The method of claim 11, wherein the first reduced power state is a lower power state than the second reduced power state, and wherein the first reduced power state and second reduced power state are lower power states than an active state.

13. The method of claim 10, comprising assigning at least a portion of each of the plurality of memory volumes of the memory device during an initialization to enter the particular state or not when the select command is issued and the at least portion of the memory volume is on a non-selected memory volume.

14. The method of claim 13, further comprising assigning the at least portion of each of the plurality of memory volumes of the memory device during initialization to enter the particular state or not when a particular memory volume is selected.

15. The method of claim 10, wherein the previous state of the at least portion of the non-selected memory volume is an active state.

16. The method of claim 15, wherein putting the at least portion of the non-selected memory volume in the particular state comprises putting a terminator memory unit of the non-selected memory volume in a pseudo reduced power state.

17. The method of claim 16, wherein putting the terminator memory unit of the non-selected memory volume in the pseudo reduced power state comprises deactivating page buffers and activating input buffers of the terminator memory unit.

18. The method of claim 16, comprising performing on die termination of the non-selected memory volume using the terminator memory unit in the pseudo reduced power state.

* * * * *